United States Patent [19]

Kasai et al.

[11] Patent Number: 5,406,135
[45] Date of Patent: Apr. 11, 1995

[54] DIFFERENTIAL CURRENT SOURCE CIRCUIT IN DAC OF CURRENT DRIVING TYPE

[75] Inventors: Kazuhiko Kasai; Kenji Matsuo; Shinji Fujii, all of Yokohama; Yasukazu Noine, Kitakyushu, all of Japan

[73] Assignee: Kabushiki Kaisha Toshiba, Kawasaki, Japan

[21] Appl. No.: 156,627

[22] Filed: Nov. 24, 1993

[30] Foreign Application Priority Data

Nov. 26, 1992 [JP] Japan .................. 4-316927

[51] Int. Cl.⁶ .......................... H03F 3/45; H03F 3/16
[52] U.S. Cl. ........................ 327/108; 327/65; 327/208; 327/530
[58] Field of Search ............ 307/279, 255, 288, 296.1, 307/296.8, 496, 497, 530, 494, 272.2

[56] References Cited

U.S. PATENT DOCUMENTS

| | | | |
|---|---|---|---|
| 4,027,294 | 5/1977 | Meusburger et al. | 307/279 |
| 4,104,733 | 8/1978 | Satoh | 307/279 |
| 4,125,878 | 11/1978 | Watanabe | 307/279 |
| 4,149,099 | 4/1979 | Nasami | 307/279 |
| 4,572,977 | 2/1986 | Takemae et al. | 307/530 |
| 4,831,282 | 5/1989 | Colles | 307/443 |
| B1 4,831,282 | 9/1992 | Colles | 307/443 |
| 5,065,045 | 11/1991 | Mok | 307/494 |

Primary Examiner—Timothy P. Callahan
Assistant Examiner—Terry L. Englund
Attorney, Agent, or Firm—Finnegan, Henderson, Farabow, Garrett & Dunner

[57] ABSTRACT

A differential current source circuit includes three P-channel MOSFETs and two N-channel MOSFETs. Each source of first and second P-channel MOSFETs is connected to a power supply, and a bias voltage is applied to each gate of the MOSFETs. A current path of the first N-channel MOSFET is connected between a drain of the first P-channel MOSFET and a ground. A current path of the third P-channel MOSFET is connected between a drain of the second P-channel MOSFET and a current output terminal. A gate of the third P-channel MOSFET is connected to the drain of the first P-channel MOSFET. One end of a current path of the second N-channel MOSFET is connected to a connecting point of the first P-channel and first N-channel MOSFETs, and the other end is connected to a connecting point of the second P-channel and third P-channel MOSFETs. A digital signal is applied to a gate of the second N-channel MOSFET.

18 Claims, 5 Drawing Sheets

DIFFERENTIAL CURRENT SOURCE CIRCUIT IN DAC OF CURRENT DRIVING TYPE

BACKGROUND OF THE INVENTION

1. Field of the Invention

The present invention relates to a differential current source circuit and more particularly to a differential current source circuit, which is a part of the structure of a digital/analog converter (DAC) of a current driving type in, for example, a color graphic system.

2. Description of the Related Art

Conventionally, an orthodox differential current source circuit used in digital to analog converters (DACs) such as a color graphics system is structured as shown in FIG. 1. This type of circuit comprises P-channel type MOSFETs P1 to P3. A current path of each of MOSFETs P1 and P2 is connected in series between a power supply $V_{DD}$ and a ground point (output terminal $\overline{Q}$). A bias voltage Vref is applied to a gate of the MOSFET P1, and a digital signal $\phi$ is inputted to a gate of the MOSFET P2. One end of a current path of the MOSFET P3 is connected to a connecting point (node ND1) between MOSFETs P2 and P3, and the other end is connected to an output terminal Q. A digital signal $\overline{\phi}$ (signal having an opposite phase to the digital signal $\phi$) is inputted to the gate of MOSFET P3.

In the differential current source circuit, the constant current, which is generated by making the MOSFET P1 conductive by the bias voltage Vref, continues to flow to one of the output terminals $\overline{Q}$ or Q via the current path of the MOSFET P2, which is in an ON state, or the current path of the MOSFET P3. However, in the circuit structure as shown in FIG. 1, timing of digital signals $\phi$ and $\overline{\phi}$ must be controlled in order to ideally transit the levels of the digital signals $\phi$ and $\overline{\phi}$. If the characteristics of MOSFETs P1 to P3 are changed due to variation during manufacturing, the voltage of the node ND1 and the output current sent from the output terminal Q will vary. Due to this, in a DAC comprising plurality of differential current source circuits connected in parallel as shown in FIG. 1, a glitch is generated by the variation of the voltage of the node ND1 of each differential current source circuit and the output current sent from the output terminal Q. In order to suitably control timing of the signals $\phi$ and $\overline{\phi}$, a driver, which controls on/off switch timing of differential switches (MOSFETs P2 and P3), is needed.

As mentioned above, in the circuit structure shown in FIG. 1, since the number of additional circuits is increased so as to reduce the influence of manufacture variation upon the element characteristic, a pattern occupying area is increased. Moreover, the level change of the digital signal $\overline{\phi}$ inputted to the gate of the MOSFET P3 is transmitted to the output terminal Q via a parasitic capacitance of the MOSFET P3. Due to this, when this type of circuit is used in a DAC, the level change in the digital signal $\overline{\phi}$ is superimposed on the analog output voltage, which is called "field through", and deterioration of a conversion accuracy occurs.

Generally, when using a DAC of a current driving type, a load such as a resistance is connected to the output terminal Q, and the DAC is terminated by impedance. Therefore, for a DAC of the current driving type, impedance (on-resistance of transistor) of the differential switch, which is seen from the output terminal Q, is low. Due to this, as the total output current becomes larger, the quantity of output current of each differential current source circuit becomes smaller. The reduction of the output current occurs by a channel length modulation effect due to a variation (reduction in this case) of voltage VDS between the drain and source when the differential switch element is an MOS transistor. Moreover, the reduction of the output current occurs by an early effect due to the variation of the voltage VCE between the collector and emitter when the differential switch element is a bipolar transistor. Such reduction of the output current cannot be disregarded as DAC resolution becomes higher.

A differential current source circuit in which the circuit of FIG. 1 is improved is disclosed in U.S. Pat. No. 4,831,282.

As shown in FIG. 2, basically, a bias voltage in place of the digital signal $\overline{\phi}$ is applied to the gate of the MOSFET P3 of the differential current source circuit of FIG. 1. More specifically, the circuit of FIG. 2 comprises three P-channel type MOSFETs P5 to P7. A current path of MOSFET P5 and that of MOSFET P6 are connected in series between a power source $V_{DD}$ and an output terminal Q. A first bias voltage Vref1 is applied to the gate of MOSFET P5, and a second bias voltage Vref2 is applied to the gate of MOSFET P6. One end of a current path of MOSFET P7 is connected to a connecting point (node ND2) between the MOSFETS P5 and P6, and the other end is connected to a ground point (output terminal $\overline{Q}$), and a digital signal $\phi$ is inputted to the gate.

In such a circuit structure, since the input of the digital signal is one-phase, it is unnecessary to consider the timing of the digital signals $\phi$ and $\overline{\phi}$, whose phases are opposite to each other, unlike the circuit of FIG. 1. Moreover, since a bias voltage Vref2 is applied to the gate of MOSFET P6, which is connected to the output terminal Q, the level change of the digital signal is not transmitted to the output terminal Q via the parasitic capacitance of MOSFET P6. Moreover, no field through is generated.

However, the level of each of the bias voltages Vref1 and Vref2 need to be highly stabilized. In the circuit of FIG. 2, even if the voltage of node ND2 is the lowest by ON/OFF of MOSFET P7, the output voltage varies about 1 V. Due to this, at the time of high speed switching, the bias voltages Vref1 and Vref2 are varied by the influence of the parasitic capacitance of MOSFETs P5 and P6, and the generation of glitch may be caused. In order to stabilize the bias voltages Vref1 and Vref2, it is required that a capacitor having a large capacitance be formed at the gates of MOSFETs P5 and P6. Moreover, since the gate bias of the output element (MOSFET P6) is constant, the output current of the differential current source circuit is reduced as the total of the output current increases. Furthermore, regarding setting time, which is the D/A conversion speed, since output impedance is driven by the voltage VGS (gate voltage VG=Vref2, source voltage VS=ND2) between the gate and source where "Vth+$\alpha$" is low, mutual conductance of MOSFET P6 is low, and the high-speed operation cannot be smoothly performed.

SUMMARY OF THE INVENTION

A first object of the present invention is to provide a differential current source circuit in which no additional circuit is provided, an operation speed is not lowered and a constant-current property is not lost even if an element characteristic varies.

A second object of the present invention is to provide a differential current source circuit for preventing reduction of output current.

A third object of the present invention is to provide a digital/analog converter of current driving type for controlling glitch generations.

A fourth object of the present invention is to provide a digital/analog converter of current driving type allowing a higher conversion speed.

The first and second objects can be attained by a differential current source circuit comprising a first current source flowing current in accordance with a bias voltage; a second current source, controlled by the bias voltage, and flowing the same quantity of current as the first current source; a first switch connected between the first current source and a first output terminal; a second switch, connected between the second current source and a second output terminal, having a reverse polarity to the first switch; and a third switch, controlled to be conductive/non-conductive by a logic signal, and electrically connecting/disconnecting the first and second current sources, wherein the first switch is controlled to be conductive/non-conductive by the potential of a connecting point between the second current source and the second switch, and the second switch is controlled to be conductive/non-conductive by the potential of a connecting point between the first current source and the first switch.

According to the above-mentioned structure, since the input of the logic signal (digital signal) is one-phase, it is unnecessary to consider the timing of the digital signals unlike the case where two-phase digital signal is used. Also, there is no need of a driver for controlling timing of switching on/off the first and second switches. Moreover, since high stability of the bias voltage is not required, there is no need of forming a capacitor having a large capacitance. Moreover, when the output current is cut off, one end of each of the first and second switches and a control end (gate and source of MOSFET) are short-circuited. Furthermore, the current is stably outputted at an operation point where two constant current paths are balanced. Due to this, the output impedance can be enhanced to several tens KΩ. Moreover, in a case where the first or second output terminal is connected to the load element, variation of the output voltage can be compensated, and the constant current can be always outputted. Therefore, the reduction of the output current can be prevented.

The third and fourth objects can be attained by a digital/analog converter of current driving type, comprising first to nth differential current source circuits to which n-bit digital signals are inputted in parallel, wherein each of the first to nth differential current source circuits including: a first transistor of a first conductive type formed such that one end of a current path is connected to a first voltage supply source and a bias voltage is applied to a control electrode; a second transistor of a first conductive type formed such that one end of the current path is connected to the first voltage supply source and the bias voltage is applied to the control electrode; a third transistor of a second conductive type, connected between other end of the current path of the first transistor and a second voltage supply source, and formed such that the control electrode is connected to the other end of the current path of the second transistor; a fourth transistor of a first conductive type, connected between other end of the current path of the second transistor and an output terminal, and formed such that the control electrode is connected to the other end of the current path of the first transistor; and a fifth transistor of a second conductive type, connected between a connecting point of the first and third transistors and a connecting point of the second and fourth transistors, and formed such that the one n-bit digital signal is supplied to the control electrode.

According to the above structure, in each of the differential current source circuits, the output impedance can be enhanced without providing an additional circuit such as a driver for switching on/off the differential switch, and a capacitor having a large capacitance. Moreover, in a case where the load element is connected to the output terminal, variation of the output voltage can be compensated, and the constant current can be always outputted. Therefore, the generation of glitch can be controlled and the conversion speed is made higher.

DETAILED DESCRIPTION OF THE PREFERRED EMBODIMENTS

Figure 4:
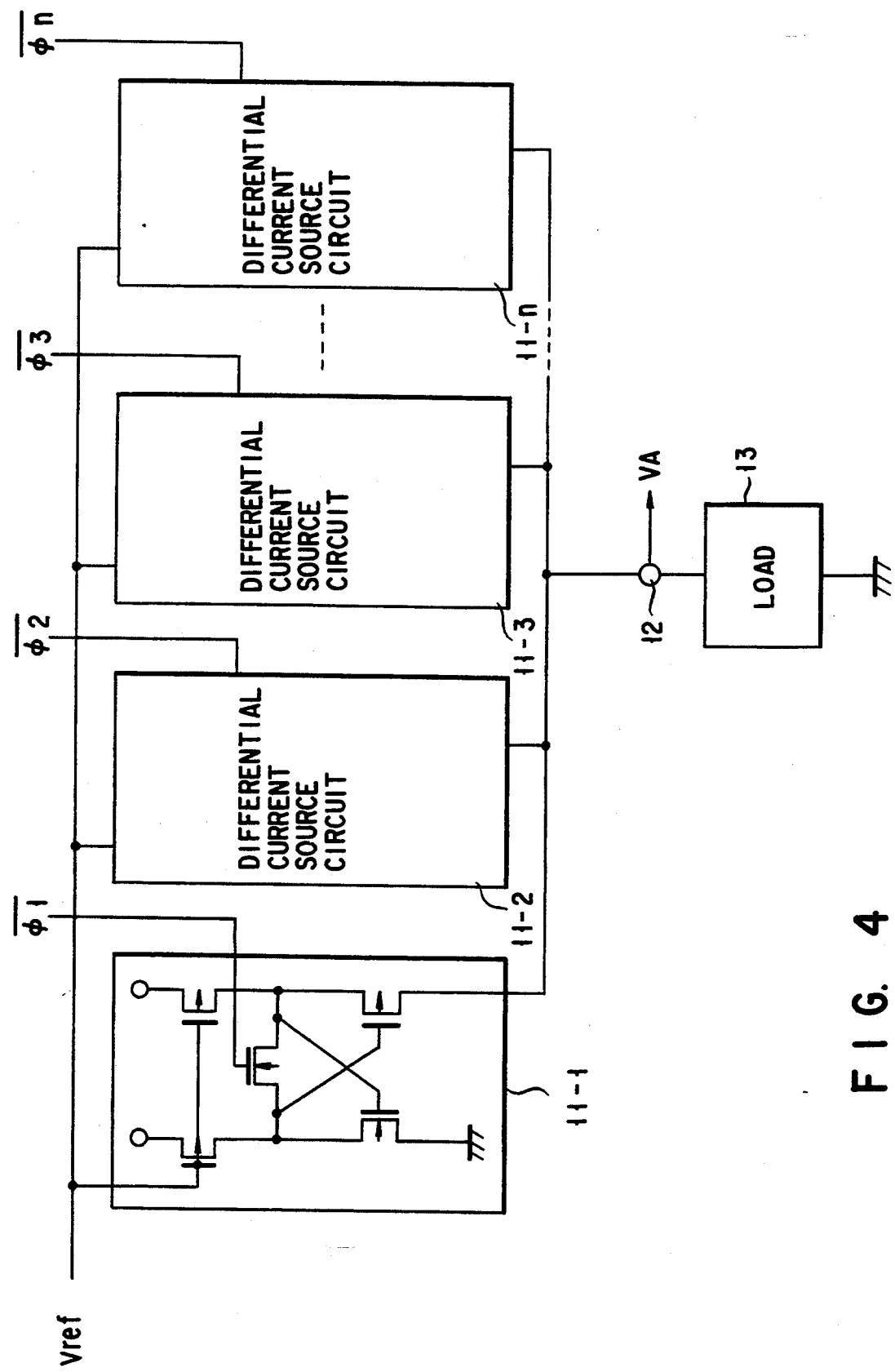
FIG. 4 is a block diagram showing a schematic structure of a DAC of current driving type according to an embodiment of the present invention.
Figure 5:
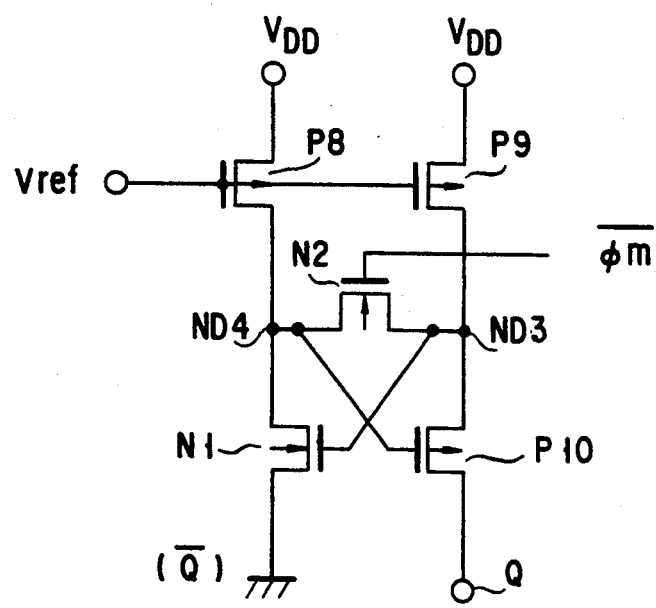
FIG. 5 explains a differential current source circuit according to the embodiment of the present invention and shows the structure of each differential current source circuit of the circuit of FIG. 4.

FIG. 4 is a block diagram showing a schematic structure of a DAC of current driving type according to an embodiment of the present invention. For example, such a structure may be built in a color graphic system. FIG. 5 shows a differential current source circuit according to the embodiment of the present invention and shows the structure for each differential current source circuit shown in FIG. 4.

As shown in FIG. 4, the DAC of current driving type comprises n number of differential current source circuits 11-1 to 11-n to which n bit digital signals $\phi 1$ to $\phi n$ are inputted in parallel. A bias voltage Vref is applied to each of differential current source circuits 11-1 to 11-n, and a current output node of each of the differential current source circuits 11-1 to 11-n is connected to an output terminal 12 in common. A load element 13 such as a resistor is connected between the output terminal 12 and a ground point. The sum of the output current of the respective circuits 11-1 to 11-n supplied to the output terminal 12 is converted to a voltage by the load element 13, and an analog voltage VA, which corresponds to digital signals $\bar{\phi}1$ to $\bar{\phi}n$ inputted from the output terminal 12, is outputted.

As shown in FIG. 5, each of the differential current source circuits 11-1 to 11-n comprises N-channel type MOSFETs N1 and N2 and P-channel type MOSFETs P8, P9, and P10. A power supply $V_{DD}$ is connected to the source of each of MOSFETs P8 and P9, serving as a constant current source, and a bias voltage Vref is applied to the gate. A current path of MOSFET N1 is connected between the drain of the MOSFET P8 and the ground point (output terminal $\bar{Q}$), and the gate of the MOSFET N1 is connected to the drain of the MOSFET P9. A current path of MOSFET P10 is connected between the drain of the MOSFET P9 and the output terminal Q, and the gate of the MOSFET P10 is connected to the drain of the MOSFET P8. Also, a current path of the MOSFET N2 is connected between the drains of MOSFETS P8 and P9. One signal $\bar{\phi}m$ (m=integer of 1 to n), which corresponds to n-bit digital signals $\bar{\phi}1$ to $\bar{\phi}n$ (logic signal of "H" level or "L" level), is inputted to the gate of the MOSFET N2.

In the above-explained structure, when the digital signal $\bar{\phi}m$ is in an "H" level, MOSFET N2 is turned on. Then, since a potential difference between a node ND3 (contact point between the drain of MOSFET P9 and the source of MOSFET P10) and a node ND4 (common contact point between the drains of MOSFET P8 and N1) becomes extremely small, a voltage VGS between the gate and source of the MOSFET P10 becomes small (VGS<Vth), and MOSFET P10 is surely cut off. Due to the cut-off of the MOSFET P10, the drain current of MOSFET P9 passes through the drain and source of MOSFET N2 and flows into the ground point via the portion between the drain and source of MOSFET N1 together with the drain current of MOSFET P8.

On the other hand, when the digital signal $\bar{\phi}m$ is in an "L" level, MOSFET N2 is turned off. The drain current of MOSFET P8 flows into the ground point via the portion between the drain and source of MOSFET N1, and the drain current of MOSFET P9 flows into the output terminal Q via the portion between the source and drain of the MOSFET P10.

The drain current of the MOSFET P8 and P9 differs for each of the differential current source circuits 11-1 to 11-n. More specifically, if the drain current of MOSFETs P8 and P9 of the differential current circuit 11-1 is set to 1 in a state that the digital signal $\bar{\phi}1$ is set to the least significant bit and the digital signal $\bar{\phi}n$ is set to the most significant bit, the drain current of the MOSFETs P8 and P9 of the differential current source circuit 11-2 is set to 2, the drain current of the MOSFETs P8 and P9 of the differential current source circuit 11-3 is set to 4, and the drain current of the MOSFETs P8 and P9 of the differential current source circuit 11-4 is set to 8. Similarly, the drain current of MOSFETs P8 and P9 of the differential current source circuits 11-5 to 11-n is 16 to $2^{(n-1)}$, respectively. In other words, the drain current of the MOSFETs P8 and P9 of each of the differential current source circuits 11-1, 11-2, 11-3, ... 11-n is set to $2^0, 2^1, 2^2, 2^3, \ldots, 2^{(n-1)}$. In the relationship of the drain current, the dimension (channel length/channel width ratio) of the MOSFETs P8 and P9 may be set to satisfy the relationship of $2^0, 2^1, 2^2, 2^3, \ldots 2^{(n-1)}$.

Figure 6:
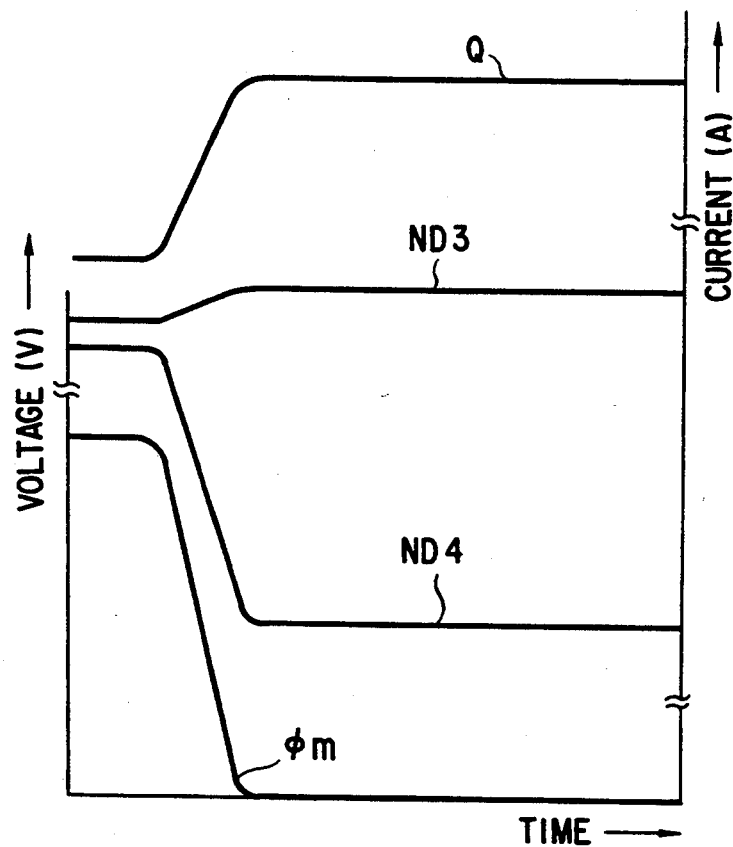
FIG. 6 is a waveform view for explaining an I/O characteristic of the differential current source circuit of FIG. 5.

FIG. 6 is a waveform showing an I/O characteristic of the differential current source circuit of FIG. 5. As shown in the figure, the voltage of the node ND3 and that of the node ND4, and the output current of the output terminal Q are stabilized. As shown in FIG. 4, when n number of differential current source circuits are connected in parallel so as to form the DAC of current driving type, generation of glitch can be prevented.

Figure 7:
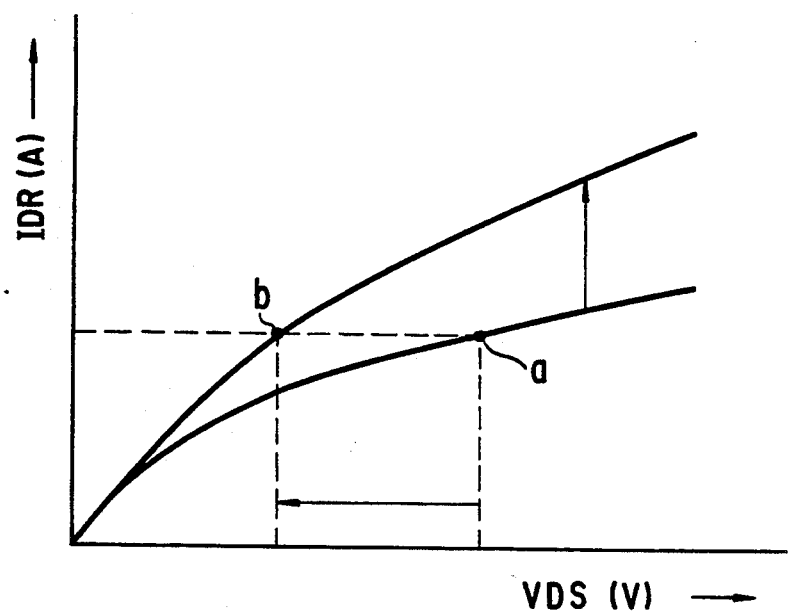
FIG. 7 is a characteristic view showing the relationship between a source-drain voltage of MOSFET, serving as an output switch element, and an output current in the differential current source circuit of FIG. 5.

In the circuit of FIG. 5, by the cascade connection and a cross couple of the gate of the switch elements (MOSFETs N1, N2, P10), the reduction of the voltage VGS between the gate and source of MOSFET P10 is compensated by voltage VGS between the gate and source of MOSFET N1 having high mutual conductance gm as shown in FIG. 7. Due to this, even if voltage VDS between the gate and source of the MOSFET P10 is reduced from level a to level b, an output current IDR does not change, a constant current can be outputted. Moreover, the circuit structure shown in FIG. 5 is not easily influenced by the change of the element characteristic of the P-channel type MOSFET and that of the N-channel type MOSFET due to manufacture variations. For example, in the case that a threshold voltage Vth of the P-channel type MOSFET is low and a threshold voltage Vth of the N-channel type MOSFET is high, the potential difference between the nodes ND3 and ND4 is increased, and leak current tends to be easily generated in the output terminal Q when the digital signal is in "H" level. However, by the cascade connection of MOSFETs N1, N2, P10 and a cross couple of the gate of MOSFETs N1, N2, the voltage of the node ND3 is increased by on-resistance of MOSFETs N1 and N2 and mutual conductance of MOSFET N1 is increased, thereby the reduction of the voltage can be compensated. Due to this, the element characteristic is not lost even if there are manufacture variations.

Figure 1:
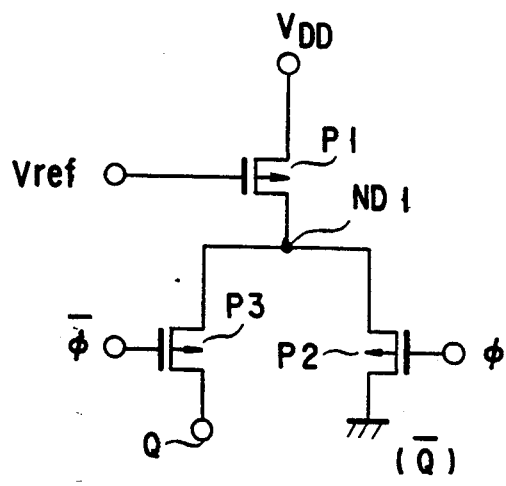
FIG. 1 is a circuit diagram showing a conventional differential current source circuit.
Figure 2:
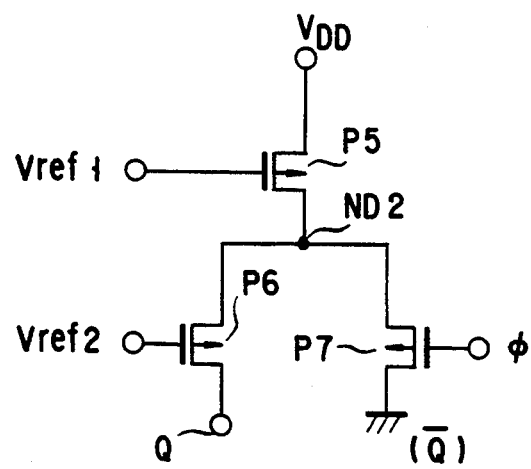
FIG. 2 is a circuit diagram showing the other conventional differential current source circuit.
Figure 3:
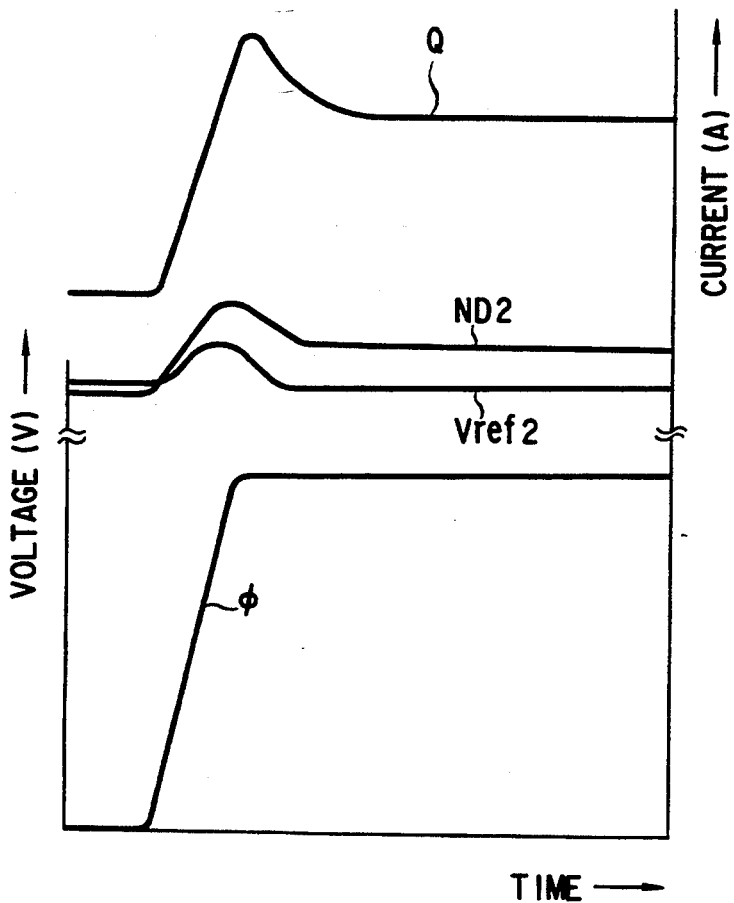
FIG. 3 is a waveform view for explaining an I/O characteristic in the circuit of FIG. 2.

Regarding the conversion speed, the circuit of FIG. 5 is superior to that of FIGS. 1 and 2.

More specifically, when the current output transits from the output terminal $\bar{Q}$ to the output terminal Q, the drain current of MOSFETs P8 and P9 flows to the node ND4. In other words, the switching operation is started in a state that the mutual conductance gm of MOSFET N1, which drives Q output switch element (MOSFET P10), is high. Due to this, the high speed switching operation can be performed. Also, if the output terminal Q reaches a state that the current is stably outputted, the mutual conductance gm of MOSFET N1 is low and the gain is lowered. As a result, the generation of the overshoot of the output and that of the undershoot cannot be easily controlled, so that the smooth output transition can be realized. Moreover, when the current output transits from the output terminal $\bar{Q}$ to the output terminal Q, the mutual conductance gm of MOSFET N1 is low and the on-resistance is high. Due to this, the potential rise (dV/dt) of the node ND4 is fast, and the voltage VGS between the gate and source of the MOSFET P10 becomes rapidly small, so that the MOSFET P10 can be speedily cut off. Furthermore, since the nodes ND3 and ND4, which on/off-controls the MOSFET P10, are operated at the necessary minimum amplitude level, the through rate is small, and this can be considered as one reason that the conversion speed becomes higher.

Therefore, the DAC of current driving type shown in FIG. 4 can control the generation of glitch, and make the conversion speed higher.

Figure 8:
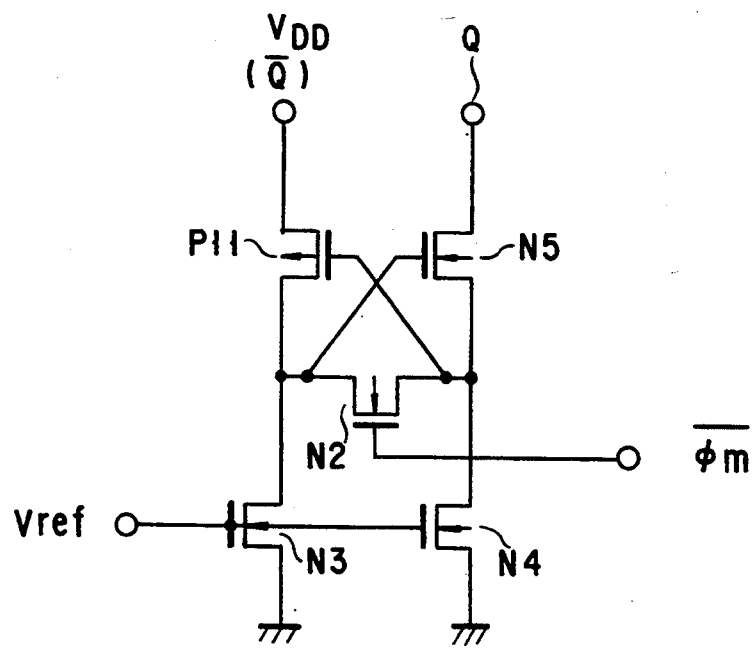
FIG. 8 explains a differential current source circuit according to the other embodiment of the present invention and shows the other structure of each differential current source circuit of FIG. 4.

FIG. 8 explains the differential current source circuit according to another embodiment of the present invention, and shows the other structure of the differential current source circuit of FIG. 4. Basically, the circuit of FIG. 8 is formed by reversing the conductive type of the MOSFETs N1, P8, P9, and P10 of the circuit of FIG. 5, and the power supply has a reverse polarity to the circuit of FIG. 5. In FIG. 8, N-channel type MOSFETs N3, N4 and N5 correspond to MOSFET P8, P9 and P10 of FIG. 5, respectively. P-channel type MOSFET P11 corresponds to MOSFET N1 of FIG. 5.

In the circuit of FIG. 5, current flows from the output terminal Q to the outer section (outer section of the chip on which the circuit is formed). The circuit of FIG. 8 differs from that of FIG. 5 in that the constant current is led in the chip from the output terminal Q. However, other basic operations of the circuit of FIG. 8 is the same as the circuit of FIG. 5, and the same technical advantage can be obtained.

Figure 9:
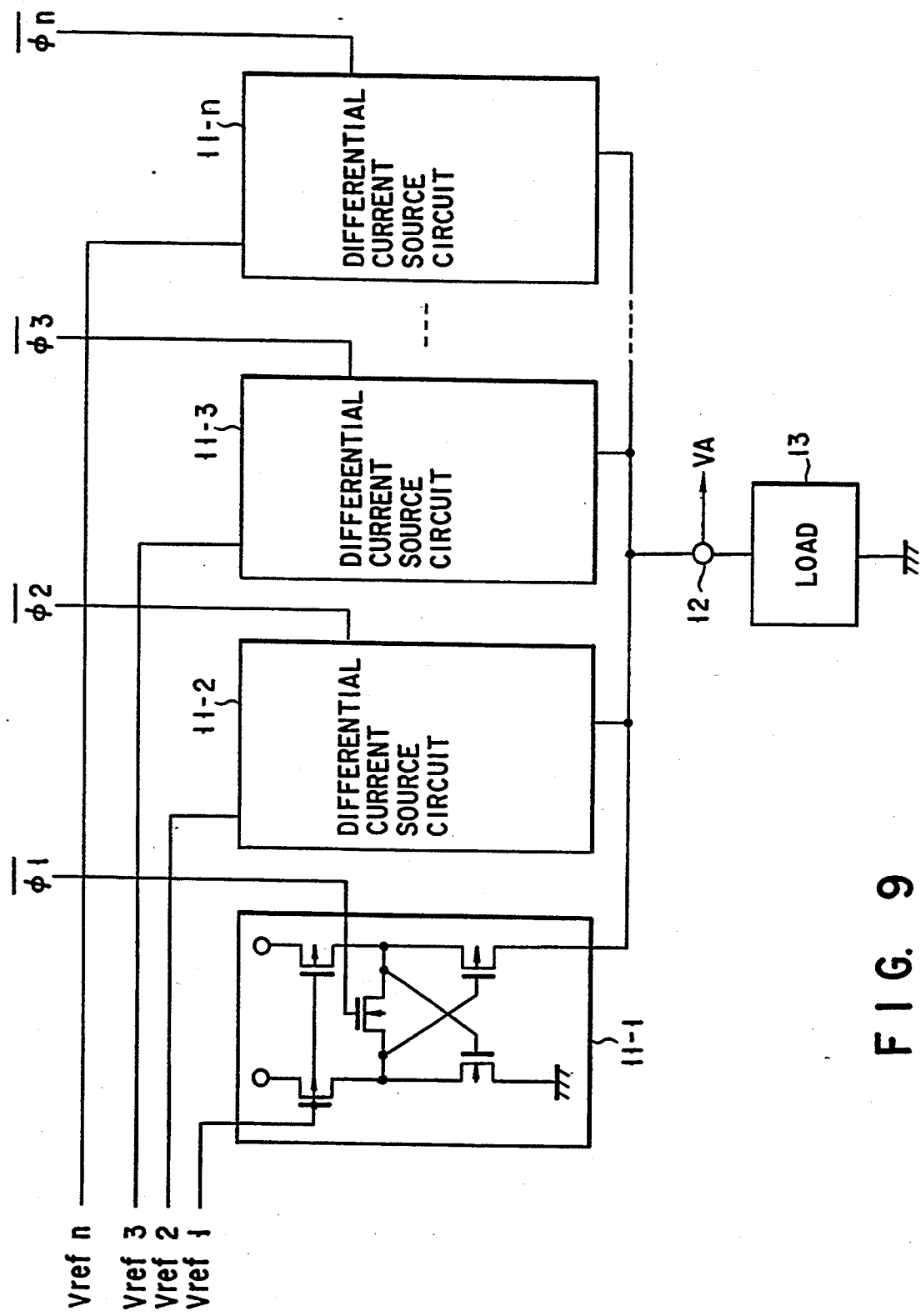
FIG. 9 is a block diagram showing the structure of DAC of current driving type according to the other embodiment of the present invention.

FIG. 9 is a block diagram showing the structure of a DAC of current driving type according to the other embodiment of the present invention. For example, such a structure may be built in a color graphic system. In the DAC of FIG. 9, different bias voltages Vref1 to Vrefn are applied to the differential current source circuits 11-1 to 11-$n$, respectively. The dimension (channel length/channel width ratio) of the MOSFETs P8 and P9 in each of circuits 11-1 to 11-$n$ is the same, and each bias voltage Vref1 to Vrefn differs. In other words, if the voltage Vref1 is set to 1 in a state that the digital signal $\bar{\phi}1$ is set to the least significant bit and the digital signal $\bar{\phi}n$ is set to the most significant bit, the voltages Vref2 to Vrefn are set to $2, 4, 8, 16, \ldots, 2^{(n-1)}$.

By setting the bias voltages as explained above, if the drain current of MOSFETs P8 and P9 of the differential current circuit 11-1 is set to 1, the drain current of the MOSFETs P8 and P9 of the differential current source circuit 11-2 is set to 2, the drain current of the MOSFETs P8 and P9 of the differential current source circuit 11-3 is set to 4, and the drain current of the MOSFETs P8 and P9 of the differential current source circuit 11-4 is set to 8. Also, the drain current of the MOSFETs P8 and P9 of the differential current source circuits 11-5 to 11-$n$ are set to $16, 32, \ldots, 2^{(n-1)}$, respectively.

In the circuit of FIG. 9, the circuit structure of FIG. 5 was used as the differential current source circuits 11-1 to 11-$n$. However, the circuit structure of FIG. 8 may be used.

What is claimed is:

1. A differential current source circuit comprising:
   a first current source providing current in accordance with a bias voltage;
   a second current source, controlled by said bias voltage, and providing a same quantity of current as said first current source;
   first switching means connected between said first current source and a first output terminal;
   second switching means, connected between said second current source and a second output terminal, said second switching means having an opposite polarity to said first switching means; and
   third switching means, controlled by a logic signal, for electrically connecting and disconnecting said first and second current sources, said first switching means being controlled to be conductive and non-conductive by a first potential of a first connecting point between said second current source and said second switching means, and said second switching means being controlled to be conductive and non-conductive by a second potential of a second connecting point between said first current source and said first switching means, wherein a ground point is connected to each of said first and second current sources, and a power supply is connected to said first terminal.

2. A differential current source circuit comprising:
   a first transistor of a first conductive type formed such that one end of a current path is connected to a first voltage supply source and a bias voltage is applied to a control electrode;
   a second transistor of a first conductive type formed such that one end of the current path is connected to said first voltage supply source and said bias voltage is applied to the control electrode;
   a third transistor of a second conductive type, connected between other end of the current path of said first transistor and a second voltage supply source, and formed such that the control electrode is connected to the other end of the current path of said second transistor;
   a fourth transistor of a first conductive type, connected between other end of the current path of said second transistor and an output terminal, and formed such that the control electrode is connected to the other end of the current path of said first transistor; and
   a fifth transistor of a second conductive type, connected between a connecting point of said first and third transistors and a connecting point of said second and fourth transistors, and formed such that a digital signal is supplied to the control electrode.

3. The differential current source circuit according to claim 2, wherein said first voltage supply source is a power supply, said first conductive type is a P-channel type, said second voltage supply source is a ground point, said second conductive type is an N-channel type, and each of said first to fifth transistors is MOSFET.

4. The differential current source circuit according to claim 2, wherein said first voltage supply source is a ground point, said first conductive type is an N-channel type, said second voltage supply source is a power supply, said second conductive type is a P-channel type, and each of said first to fifth transistors is MOSFET.

5. A digital/analog converter of current driving type comprising:
   first to nth differential current source circuits to which n-bit digital signals are inputted in parallel; and
   each of said first to nth differential current source circuits including:
   a first current source flowing current in accordance with a bias voltage;
   a second current source, controlled by said bias voltage, and flowing the same quantity of current as said first current source;
   first switching means connected between said first current source and a first output terminal;
   second switching means, connected between said second current source and a second output terminal, having a reverse polarity to said first switching means; and
   third switching means, controlled to be conductive/non-conductive by said n-bit digital signal, and electrically connecting/disconnecting said first and second current sources, wherein said first switching means is controlled to be conductive/non-conductive by the potential of a connecting point between said second current source and said second switching means, and said second switching means is controlled to be conductive/non-conductive by the potential of a connecting point between said first current source and said first switching means.

6. The digital/analog converter according to claim 5, wherein a power supply is connected to each of said first and second current sources in said first to nth differential current source circuits, a ground point is connected to said first output terminal, each of said first to nth differential current source circuits is connected to said second output terminal in common, and the sum of the current outputted from said first to nth differential current source circuits is converted to a voltage by a load connected to said second output terminal, thereby outputting an analog voltage.

7. The digital/analog converter according to claim 5, wherein a ground point is connected to each of said first and second current sources in said first to nth differential current source circuits, a power supply is connected to said first output terminal, each of said first to nth differential current source circuits is connected to said second output terminal in common, and the sum of the current outputted from said first to nth differential current source circuits is converted to a voltage by a load connected to said second output terminal, thereby outputting an analog voltage.

8. The digital/analog converter according to claim 5, wherein current values flowed by said first and second current sources provided in the first to nth differential current source circuits differ between said first to nth differential current source circuits, respectively.

9. The digital/analog converter according to claim 5, wherein current values flowed by said first and second current sources provided in the first to nth differential current source circuits are related to $2^X$ (X=integer of 0 to n−1) in said first to nth differential current source circuits, respectively.

10. The digital/analog converter according to claim 5, wherein the bias voltages to be applied to the the first to nth differential current source circuits differ between said first to nth differential current source circuits, respectively.

11. The digital/analog converter according to claim 5, wherein the bias voltage to be applied to said first to nth differential current source circuits are related to $2^X$ (X=integer of 0 to n−1) in said first to nth differential current source circuits, respectively.

12. A digital/analog converter of current driving type, comprising:
first to nth differential current source circuits to which n-bit digital signals are inputted in parallel wherein each of said first to nth differential current source circuits is connected to said output terminal in common and the sum of the current outputted from said first to nth differential current source circuits is converted to a voltage by a load connected to said second output terminal, thereby outputting an analog voltage,
each of said first to nth differential current source circuits including:
a first transistor of a first conductive type formed such that one end of a current path is connected to a first voltage supply source and a bias voltage is applied to a control electrode;
a second transistor of a first conductive type formed such that one end of the current path is connected to said first voltage supply source and said bias voltage is applied to the control electrode;
a third transistor of a second conductive type, connected between other end of the current path of said first transistor and a second voltage supply source, and formed such that the control electrode is connected to the other end of the current path of said second transistor;
a fourth transistor of a first conductive type, connected between other end of the current path of said second transistor and an output terminal, and formed such that the control electrode is connected to the other end of the current path of said first transistor; and
a fifth transistor of a second conductive type, connected between a connecting point of said first and third transistors and a connecting point of said second and fourth transistors, and formed such that said one n-bit digital signal is supplied to the control electrode.

13. The digital/analog converter according to claim 12, wherein said first voltage supply source is a power supply, said first conductive type is a P-channel type, said second voltage supply source is a ground point, said second conductive type is an N-channel type, and each of said first to fifth transistors is MOSFET.

14. The digital/analog converter according to claim 12, wherein said first voltage supply source is a ground point, said first conductive type is an N-channel type, said second voltage supply source is a power supply, said second conductive type is a P-channel type, and each of said first to fifth transistors is MOSFET.

15. The digital/analog converter according to claim 12, wherein a channel length/channel width ratio of the first and second MOSFETs provided in the first to nth differential current source circuits differ between said first to nth differential current source circuits, respectively.

16. The digital/analog converter according to claim 12, wherein current values flowed by said first and second current sources provided in the first to nth differential current source circuits are related to $2^X$ (X=integer of 0 to n−1) in said first to nth differential current source circuits, respectively.

17. The digital/analog converter according to claim 12, wherein the bias voltages to be applied to the the first to nth differential current source circuits differ between said first to nth differential current source circuits, respectively.

18. The digital/analog converter according to claim 12, wherein the bias voltage to be applied to said first to nth differential current source circuits are related to $2^X$ (X=integer of 0 to n−1) in said first to nth differential current source circuits, respectively.

* * * * *